US009202697B2

(12) United States Patent
Luo et al.

(10) Patent No.: US 9,202,697 B2
(45) Date of Patent: Dec. 1, 2015

(54) FORMING A GATE BY DEPOSITING A THIN BARRIER LAYER ON A TITANIUM NITRIDE CAP

(71) Applicant: GLOBALFOUNDRIES Inc., Grand Cayman (KY)

(72) Inventors: Tien-Ying Luo, Clifton Park, NY (US); Feng Zhou, Beacon, NY (US); Yan Ping Shen, Saratoga Springs, NY (US); Haiting Wang, Clifton Park, NY (US); Haoran Shi, Malta, NY (US); Wei Hua Tong, Mechanicville, NY (US); Seung Kim, Andover, MA (US); Yong Meng Lee, Mechanicville, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 13/946,485

(22) Filed: Jul. 19, 2013

(65) Prior Publication Data

US 2015/0024585 A1   Jan. 22, 2015

(51) Int. Cl.
*H01L 21/28* (2006.01)
*H01L 29/66* (2006.01)

(52) U.S. Cl.
CPC .... *H01L 21/28088* (2013.01); *H01L 21/28176* (2013.01); *H01L 29/6659* (2013.01)

(58) Field of Classification Search
CPC .................. H01L 21/28229; H01L 21/28088; H01L 21/28176; H01L 29/6659
USPC ......................................................... 438/591
See application file for complete search history.

(56) References Cited

U.S. PATENT DOCUMENTS

| | | | |
|---|---|---|---|
| 2010/0178772 A1* | 7/2010 | Lin et al. ....................... | 438/703 |
| 2010/0197128 A1* | 8/2010 | Schaeffer et al. ............. | 438/591 |
| 2010/0289089 A1* | 11/2010 | Carter et al. ................... | 257/392 |
| 2011/0291198 A1* | 12/2011 | Ando et al. .................... | 257/368 |
| 2013/0130460 A1* | 5/2013 | Liao et al. ..................... | 438/299 |

\* cited by examiner

*Primary Examiner* — Peter Bradford
(74) *Attorney, Agent, or Firm* — Heslin Rothenberg Farley & Mesiti P.C.; Victor A. Cardona, Esq.

(57) ABSTRACT

A method includes forming a gate structure by growing an interfacial layer on a substrate, depositing a High K layer on the interfacial layer, depositing a TiN Cap on the High K layer and forming a thin barrier layer on the TiN Cap. The gate structure is annealed.

11 Claims, 8 Drawing Sheets

FORMING A GATE BY DEPOSITING A THIN BARRIER LAYER ON A TITANIUM NITRIDE CAP

FIELD OF THE INVENTION

The present invention generally relates to semiconductor devices and methods of fabricating semiconductor devices, and more particularly, to methods of fabricating gate structures for semiconductor devices.

BACKGROUND OF THE INVENTION

A finished gate structure (such as a finished gate or transistor gate) is the transistor terminal that modulates channel conductivity. Two principle approaches for forming high-k metal gate CMOS semiconductor device gate structures are the gate-first and gate-last process approaches.

FIG. 1 depicts a conventional gate structure having a substrate 10, an oxide layer 20 and a polysilicon layer 30. Substrate 10 includes a source 40 and a drain 50. FIG. 2 depicts a Gate-last High K metal gate which includes a substrate 110, an interfacial layer 120, a high dielectric constant (High K) layer 125, and metal gate 130. Substrate 110 also includes a source 140 and a drain 150.

During the formation of such gate structures, a titanium nitride (TiN) cap may be applied between the high K layer and the metal gate. An amorphous silicon cap may be applied to the TiN cap followed by a post cap reliability anneal and an amorphous silicon cap strip. The strip of the Si cap may result in an increase in TiN surface roughness and to portions thereof being lost, thereby leading to metal work function shift and a degradation in gate stack reliability.

Accordingly, a need exists for improved systems and methods for forming semiconductor device gate structures.

BRIEF SUMMARY

The shortcomings of the prior art are overcome and advantages are provided through the provision, in one aspect, of a method which includes forming a gate structure by growing an interfacial layer on a substrate, depositing a High K layer on the interfacial layer, depositing a TiN Cap on the High K layer and forming a barrier layer on the TiN Cap. The gate structure is annealed.

Additional features and advantages are realized through the techniques of the present invention. Other embodiments and aspects of the invention are described in detail herein and are considered a part of the claimed invention.

BRIEF DESCRIPTION OF THE SEVERAL VIEWS OF THE DRAWINGS

One or more aspects of the present invention are particularly pointed out and distinctly claimed as examples in the claims at the conclusion of the specification. The foregoing and other objects, features, and advantages of the invention are apparent from the following detailed description taken in conjunction with the accompanying drawings in which:

DETAILED DESCRIPTION

Aspects of the present invention and certain features, advantages, and details thereof, are explained more fully below with reference to the non-limiting embodiments illustrated in the accompanying drawings. Descriptions of well-known materials, fabrication tools, processing techniques, etc., are omitted so as to not unnecessarily obscure the invention in detail. It should be understood, however, that the detailed description and the specific examples, while indicating embodiments of the invention, are given by way of illustration only, and are not by way of limitation. Various substitutions, modifications, additions, and/or arrangements within the spirit and/or scope of the underlying inventive concepts will be apparent to those skilled in the art from this disclosure.

Figure 1:
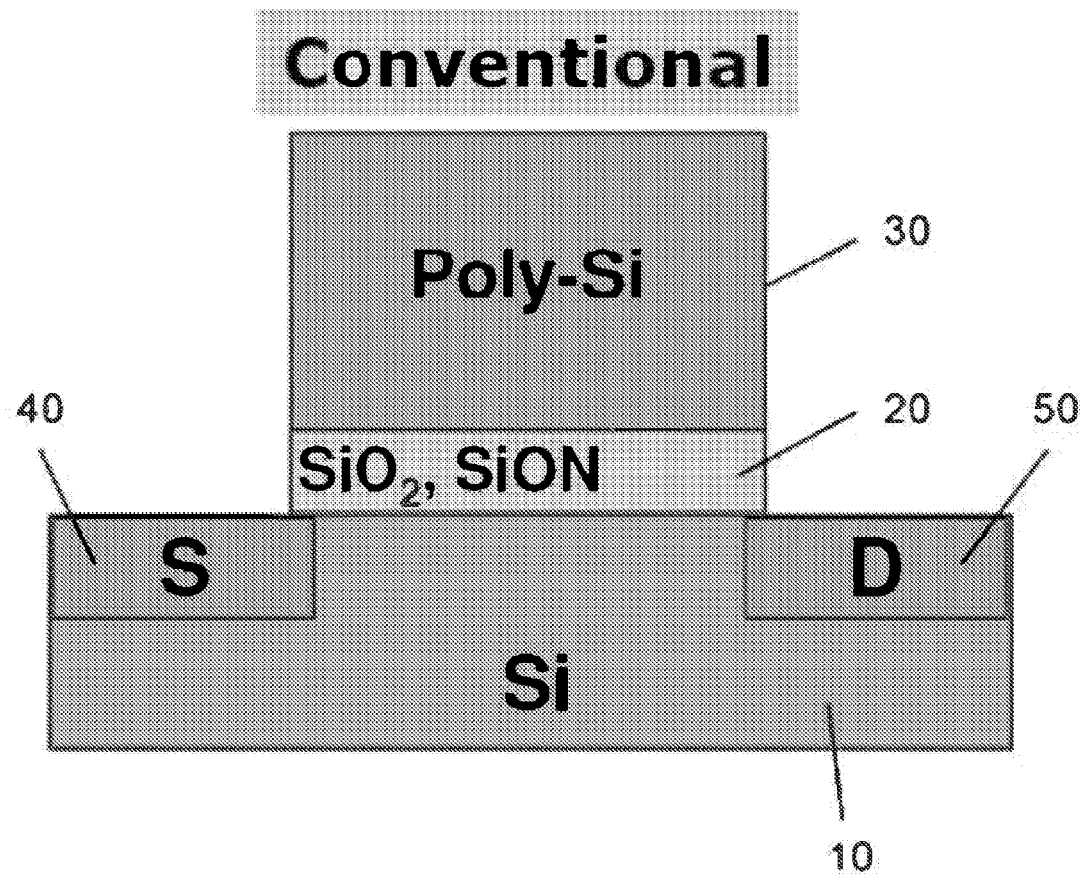
FIG. 1 is a side cross-sectional view of a prior art gate structure.
Figure 2:
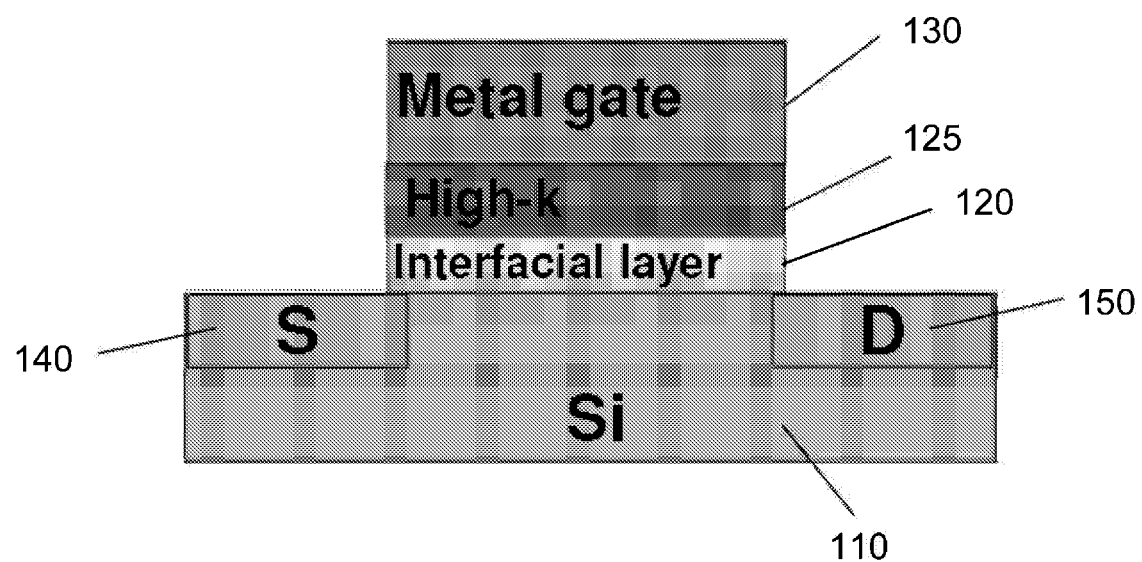
FIG. 2 is a side cross-sectional view of another prior art gate structure.
Figure 3:
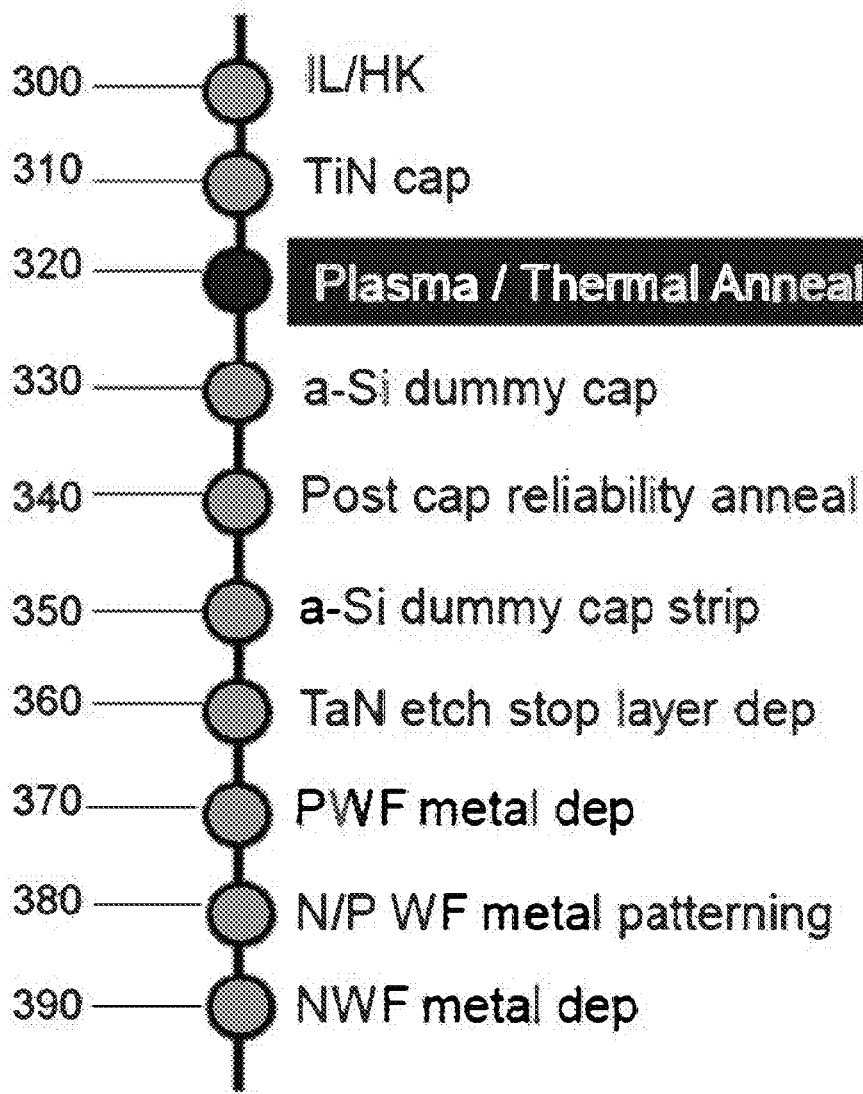
FIG. 3 is a flow chart for forming a gate structure in accordance with the present invention.

Referring to FIG. 3, a flow chart is depicted for the formation of a High K metal gate for a semiconductor device. As described above and referring to FIGS. 3 and 4, a substrate (e.g., silicon) may have an interfacial layer 220 and high-K layer 230 applied thereto in step 300. A TiN cap may be deposited in step 310. A treatment of inert gas (e.g., nitrogen or argon) 240 may be performed in step 320 as part of a plasma or thermal annealing process of an intermediate gate structure 200 which includes the substrate having the interfacial layer and high K layer applied thereto.

The treatment (e.g., nitrogen or argon) described above relative to the annealing step includes an inert gas which minimizes a thickness increase in the interfacial layer due to the function of a thin barrier layer caused by the treatment to inhibit migration of oxygen into the high-K layer. Optimized process could provide sufficient thermal budget required for gate stack reliability and thus may minimize or eliminate a need to deposit the amorphous silicon dummy cap, conduct reliability anneal and then strip the amorphous silicon dummy cap. The stripping of the silicon cap may result in an increase in TiN roughness and to portions thereof being lost, thereby leading to metal work function shift and a degradation in gate stack reliability. The barrier layer also inhibits migration of the oxygen into and past the interfacial layer into the substrate. The thickness increase of the interfacial layer is thus minimized or suppressed.

The annealing described above may also modulate film properties of the TiN cap and interface property between high-k and TiN cap, and result in a reduction in the NMOS metal work function.

As indicated in steps 360 to 390 in FIG. 3, the remainder of the gate structure may be formed. In step 360, a TaN etch stop layer dep may be performed followed by a P-type metal oxide semiconductor (PMOS) work function metal deposit in FIG. 370. The patterning of N/P work function metals may be done in step 380 followed by a N-type metal oxide semiconductor (NMOS) work function metal deposit in step 390.

Figure 4:
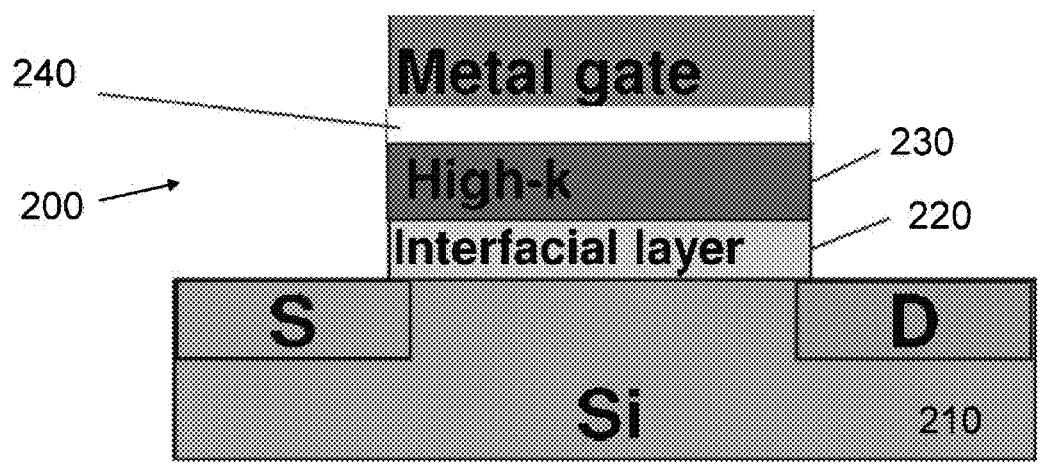
FIG. 4 is a side cross-sectional view of a gate structure in accordance with the present invention.
Figure 5:
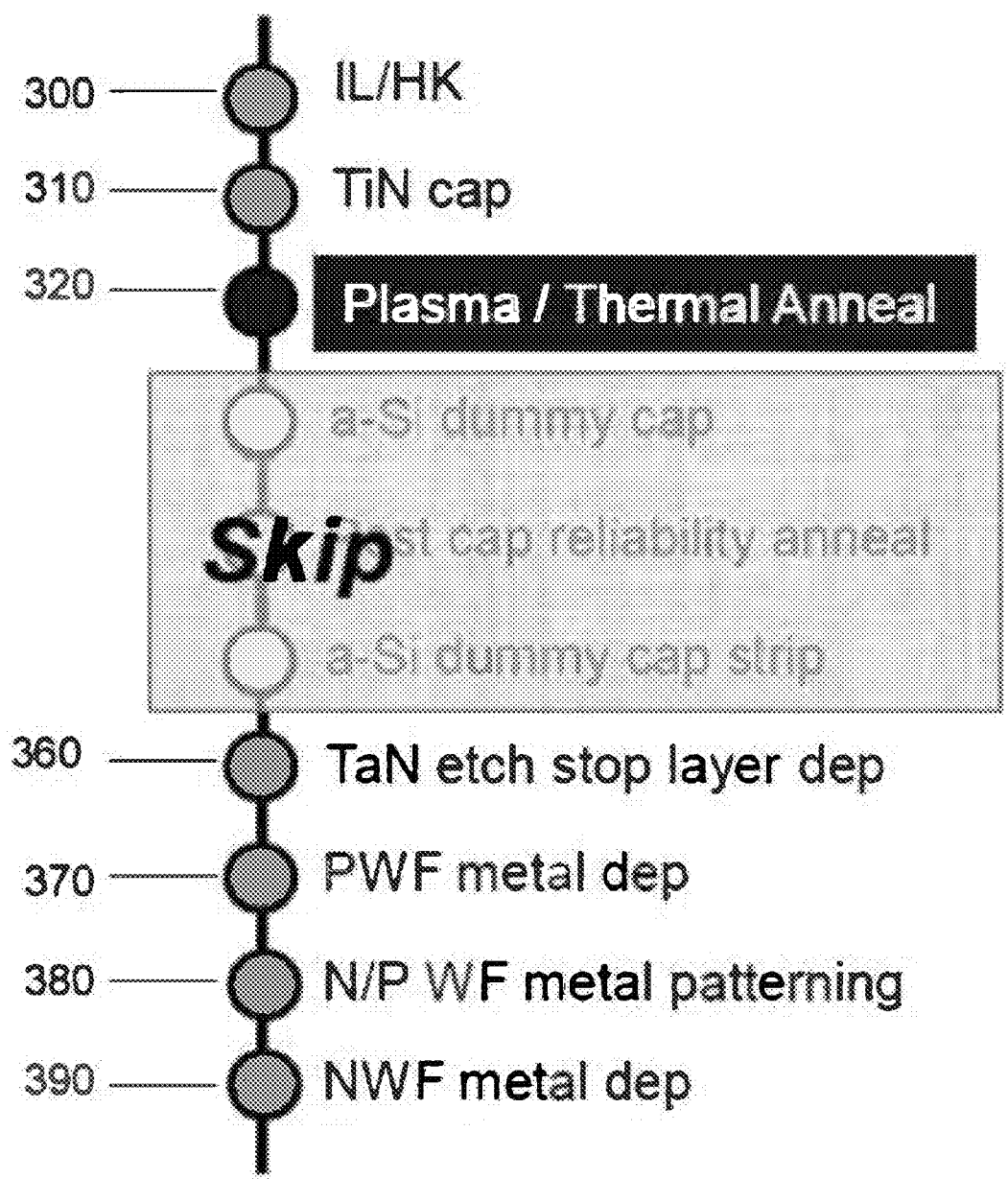
FIG. 5 is a flowchart for forming the gate structure of FIG. 4.

As depicted in FIG. 5, steps 330-350 listed in FIG. 4 may be eliminated with the rest of the steps remaining and therefore resulting in increased reliability and better work function due to the lack of damage to the TiN cap caused by the stripping of the amorphous silicon dummy cap with the attendant roughness increase of the TiN cap.

Figure 6:
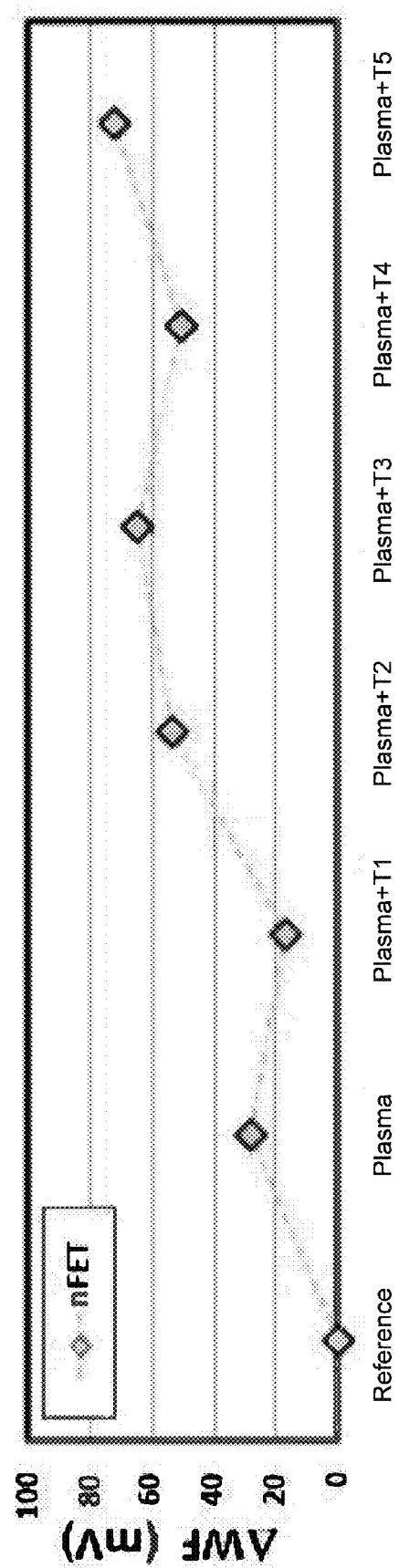
FIG. 6 is a chart indicating the work function results of the adjustment of an annealing process.
Figure 7:
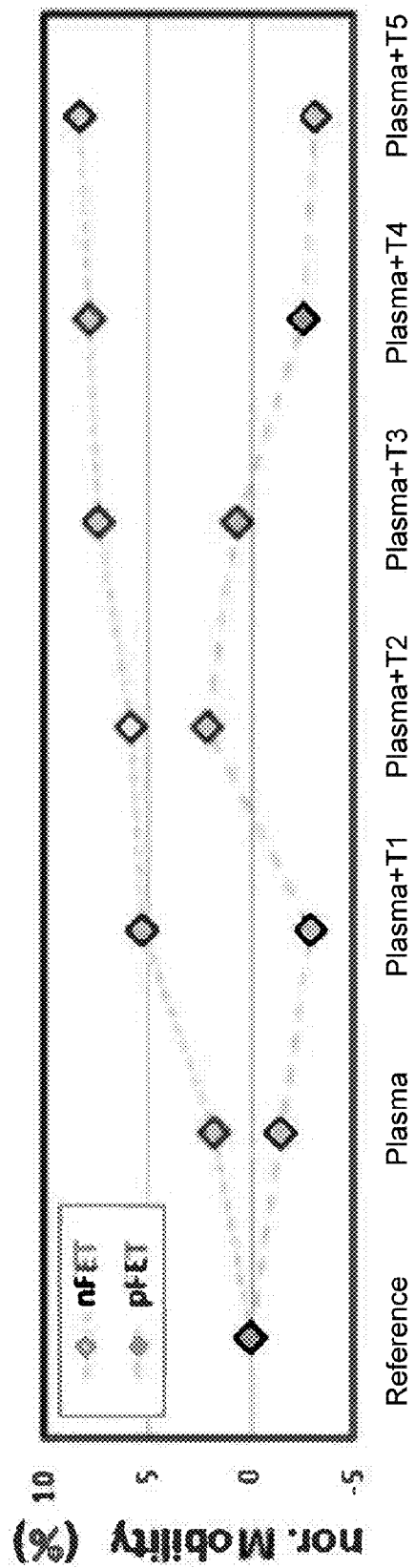
FIG. 7 is a chart indicating nFET and pFET mobility.
Figure 8:
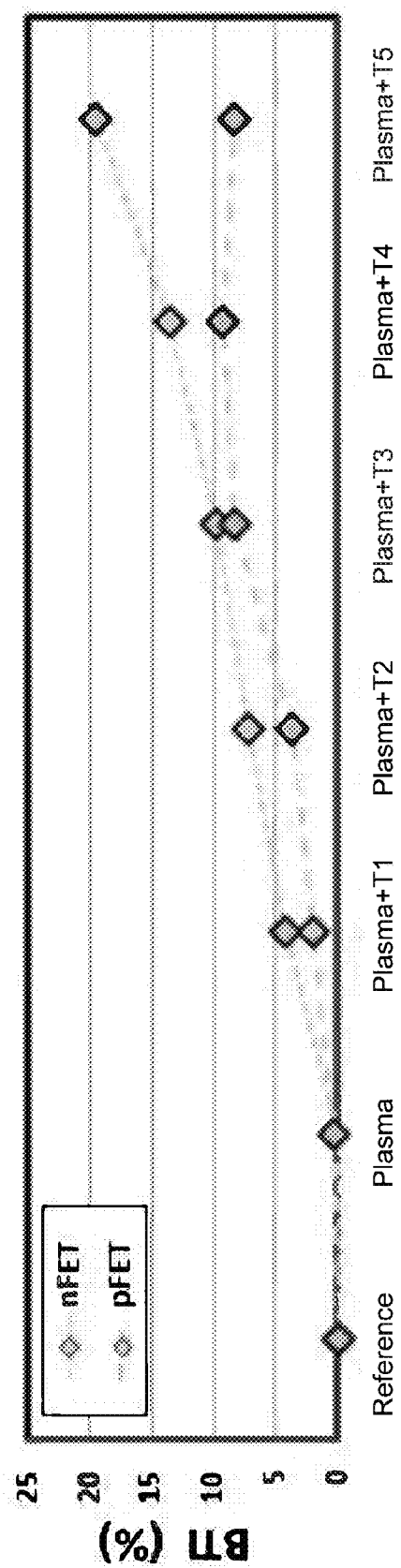
FIG. 8 is a chart indicating nFET and pFET BTI reliability.

Further, the work function of the gate structure may be tuned by varying an amount of nitrogen and manipulating the annealing temperature (e.g., at 700-1000 C, and/or soaking or spiking) As depicted in FIG. 6, for example, at about 80 mV work function tuning may be achieved by adjusting the annealing conditions. As depicted in FIG. 7, the annealing step may yield comparable or improved carrier mobility for both nFET and pFET with reliability improving with treatment temperature. Further, this supports the inert gas element (e.g., nitrogen) remaining in the HK layer and not in the interfacial layer/silicon layer interface which is desirable.

As depicted in FIG. 9, the annealing step also results in a wide range of reliability improvement, as compared to having a baseline without such treatments.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprise" (and any form of comprise, such as "comprises" and "comprising"), "have" (and any form of have, such as "has" and "having"), "include" (and any form of include, such as "includes" and "including"), and "contain" (and any form contain, such as "contains" and "containing") are open-ended linking verbs. As a result, a method or device that "comprises", "has", "includes" or "contains" one or more steps or elements possesses those one or more steps or elements, but is not limited to possessing only those one or more steps or elements. Likewise, a step of a method or an element of a device that "comprises", "has", "includes" or "contains" one or more features possesses those one or more features, but is not limited to possessing only those one or more features. Furthermore, a device or structure that is configured in a certain way is configured in at least that way, but may also be configured in ways that are not listed.

The corresponding structures, materials, acts, and equivalents of all means or step plus function elements in the claims below, if any, are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of one or more aspects of the invention and the practical application, and to enable others of ordinary skill in the art to understand one or more aspects of the invention for various embodiments with various modifications as are suited to the particular use contemplated.

What is claimed is:

1. A method, comprising:
   forming a gate structure by:
      depositing an interface layer on a substrate
      depositing a high K layer on the interface layer
      depositing a TiN cap on the high K layer
      forming a barrier layer on the TiN cap by applying a treatment of nitrogen gas or argon gas and
   annealing the gate structure.

2. The method of claim 1 wherein the annealing comprises one of plasma annealing and thermal annealing.

3. The method of claim 1 wherein applying the treatment comprises varying an amount of nitrogen and manipulating an annealing temperature during the annealing to tune a work function.

4. The method of claim 3 wherein the manipulating the annealing temperature comprises manipulating the annealing temperature in a range of 700 degrees Celsius to 1000 degrees Celsius.

5. The method of claim 1 further comprising depositing an amorphous silicon dummy cap on the gate structure.

6. The method of claim 5 further comprising performing a post cap reliability anneal.

7. The method of claim 6 further comprising performing an amorphous silicon dummy cap strip.

8. The method of claim 7 further comprising performing a TaN etch stop layer deposit.

9. The method of claim 8 further comprising depositing a PMOS work function metal layer on the gate structure.

10. The method of claim 9 further comprising patterning the metal layer to remove at least a portion of the PMOS work function metal layer.

11. The method of claim 10 further comprising depositing a NMOS work function metal layer on the gate structure.

* * * * *